US012764991B2

(12) United States Patent
Matsumoto et al.

(10) Patent No.: US 12,764,991 B2
(45) Date of Patent: Oct. 13, 2026

(54) SEMICONDUCTOR DEVICE, SEMICONDUCTOR MODULE, AND WIRELESS COMMUNICATION APPARATUS

(71) Applicant: SONY SEMICONDUCTOR SOLUTIONS CORPORATION, Kanagawa (JP)

(72) Inventors: Katsuji Matsumoto, Kanagawa (JP); Naoki Kakoiyama, Kanagawa (JP)

(73) Assignee: SONY SEMICONDUCTOR SOLUTIONS COPORATION, Kanagawa (JP)

( * ) Notice: Subject to any disclaimer, the term of this patent is extended or adjusted under 35 U.S.C. 154(b) by 346 days.

(21) Appl. No.: 18/579,634

(22) PCT Filed: Mar. 18, 2022

(86) PCT No.: PCT/JP2022/012645
§ 371 (c)(1),
(2) Date: Jan. 16, 2024

(87) PCT Pub. No.: WO2023/013143
PCT Pub. Date: Feb. 9, 2023

(65) Prior Publication Data

US 2024/0322028 A1 Sep. 26, 2024

(30) Foreign Application Priority Data

Aug. 6, 2021 (JP) ................................ 2021-130331

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/824* (2025.01);
(Continued)

(58) Field of Classification Search
CPC ............ H10D 30/015; H10W 40/231; H10W 40/233; H10W 40/20; H10W 40/22
See application file for complete search history.

(56) References Cited

U.S. PATENT DOCUMENTS

2006/0055028 A1* 3/2006 Hasunuma ............ H10W 40/22 257/713
2015/0364591 A1* 12/2015 Lu ........................ H10D 30/015 257/194
(Continued)

FOREIGN PATENT DOCUMENTS

CN 111490099 A * 8/2020 ............ H10W 40/22
CN 112993027 A * 6/2021 ............ H10W 20/20
(Continued)

OTHER PUBLICATIONS

International Search Report and Written Opinion of PCT Application No. PCT/JP2022/012645, issued on May 31, 2022, 10 pages of ISRWO.

*Primary Examiner* — Evren Seven
(74) *Attorney, Agent, or Firm* — CHIP LAW GROUP

(57) ABSTRACT

Provided is a semiconductor device having high heat dissipation and high operation reliability. This semiconductor device includes a semiconductor substrate, a first semiconductor layer that is provided on the semiconductor substrate, has a first aperture, and has a first thermal conductivity, a transistor (Tr) provided on the first semiconductor layer, and a heat dissipation unit that is in contact with the semiconductor substrate via the first aperture and has a second thermal conductivity higher than the first thermal conductivity.

12 Claims, 8 Drawing Sheets

(51) Int. Cl.

| | |
|---|---|
| ***H10D 62/824*** | (2025.01) |
| ***H10D 62/85*** | (2025.01) |
| ***H10D 84/82*** | (2025.01) |
| ***H10W 40/10*** | (2026.01) |

(52) U.S. Cl.

CPC ............ *H10D 84/82* (2025.01); *H10W 40/10* (2026.01); *H10D 62/8503* (2025.01)

(56) References Cited

U.S. PATENT DOCUMENTS

| | | | | |
|---|---|---|---|---|
| 2017/0170094 | A1* | 6/2017 | Maples | H10W 40/254 |
| 2023/0282645 | A1* | 9/2023 | Wohlmuth | H10D 30/475<br>257/194 |

FOREIGN PATENT DOCUMENTS

| | | | | | |
|---|---|---|---|---|---|
| CN | 113035935 | A | * | 6/2021 | H10W 40/258 |
| JP | 2005109133 | A | * | 4/2005 | H10W 40/25 |
| JP | 3791459 | B2 | | 6/2006 | |
| JP | 2010-067662 | A | | 3/2010 | |
| JP | 2012-119469 | A | | 6/2012 | |
| JP | 2018-041785 | A | | 3/2018 | |
| KR | 20060007093 | A | * | 1/2006 | H10D 30/015 |

* cited by examiner

[FIG. 1]
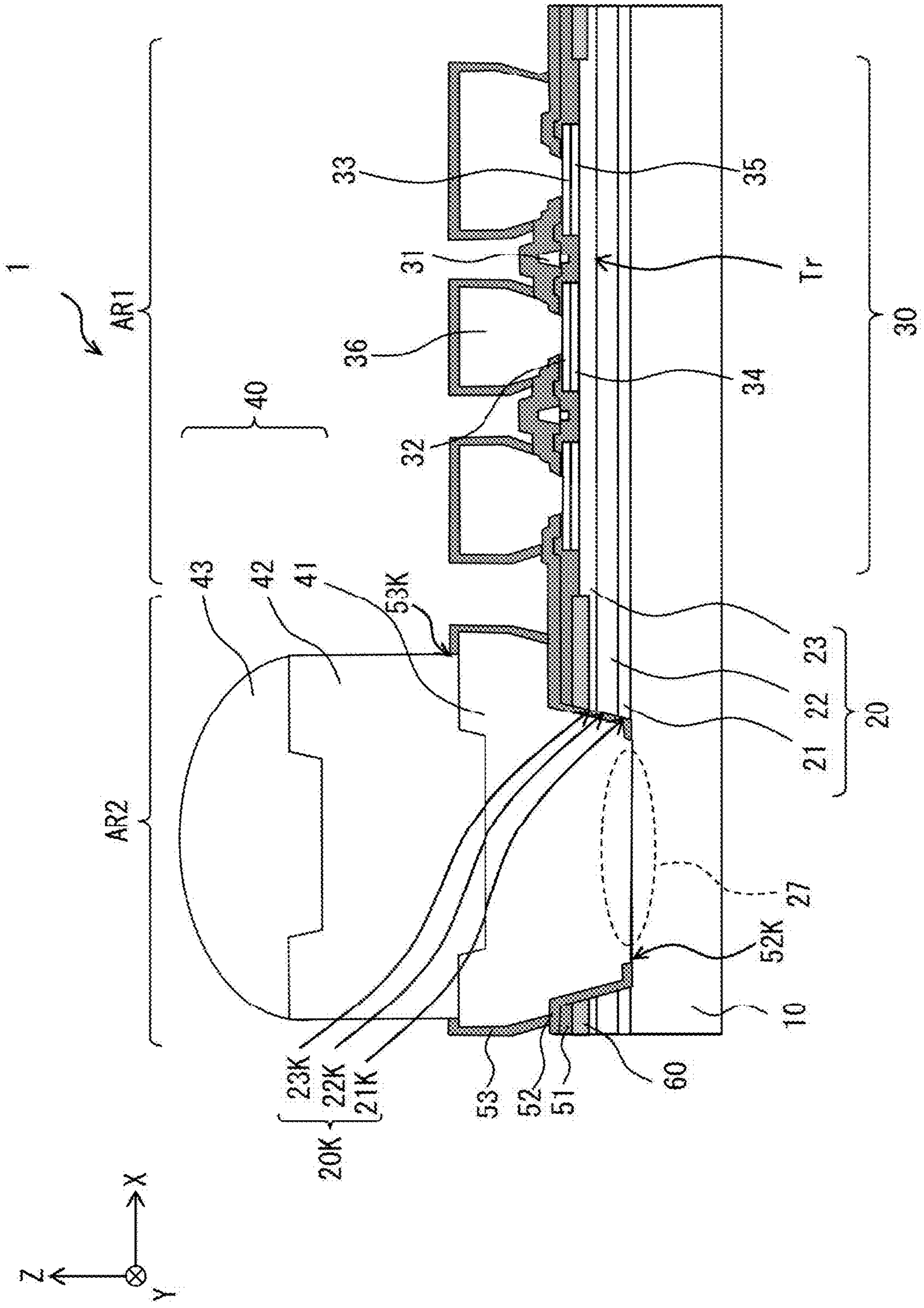

[ FIG. 2 ]
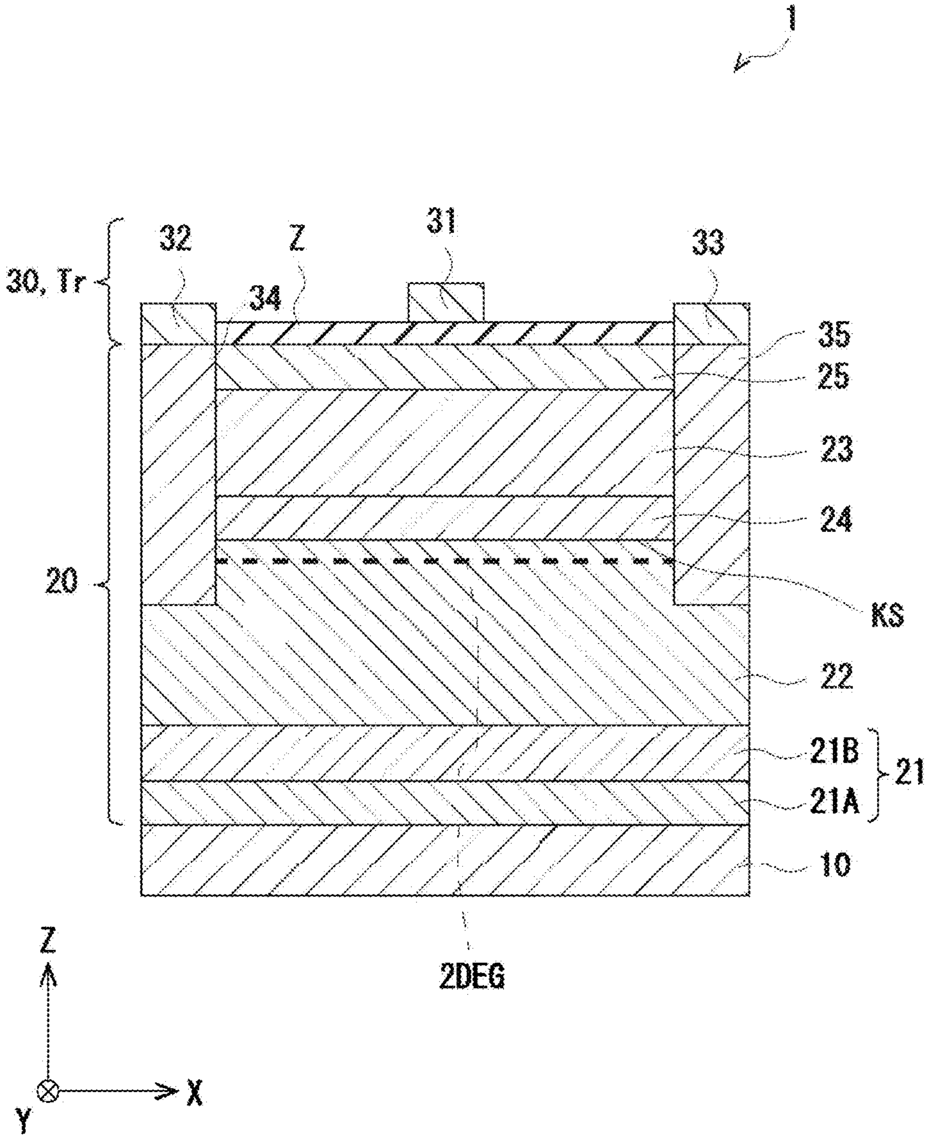

[ FIG. 3A ]
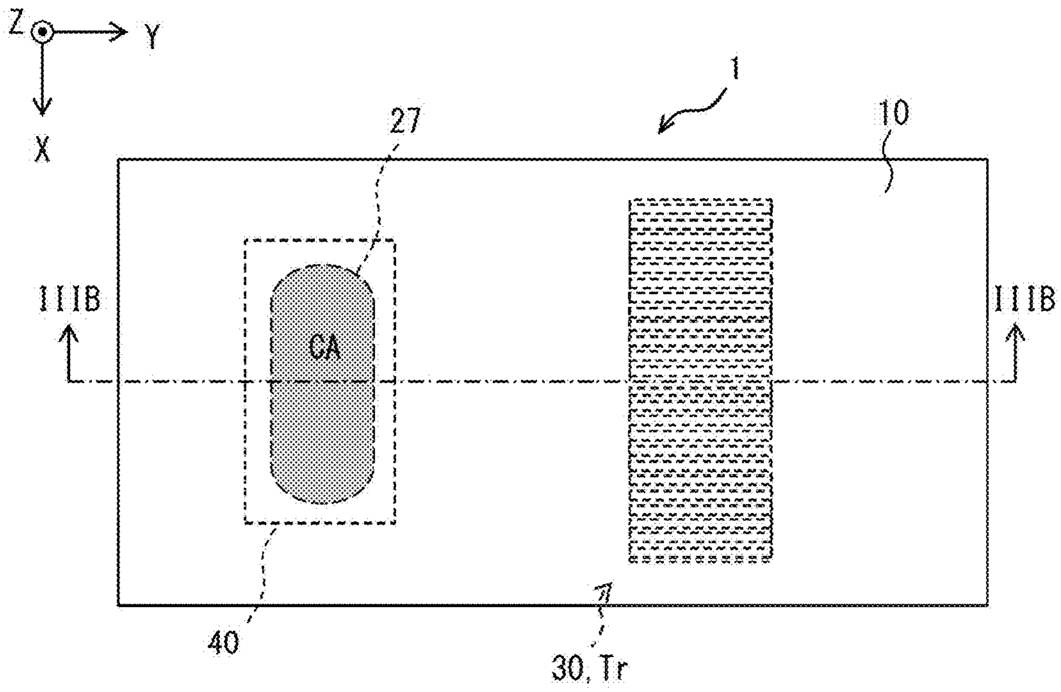
[ FIG. 3B ]
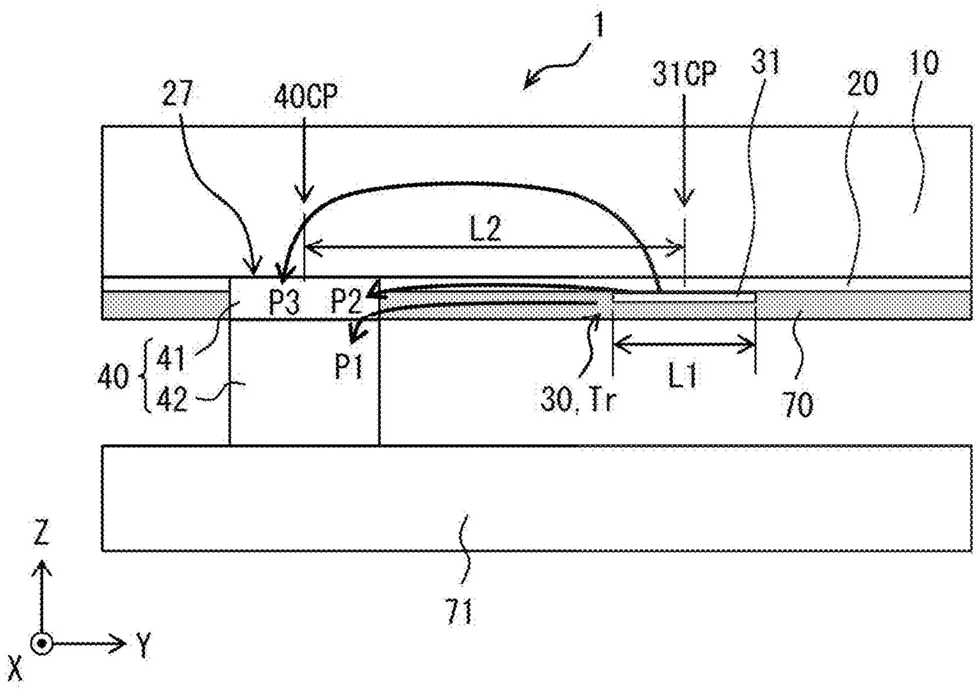

[ FIG. 4 ]
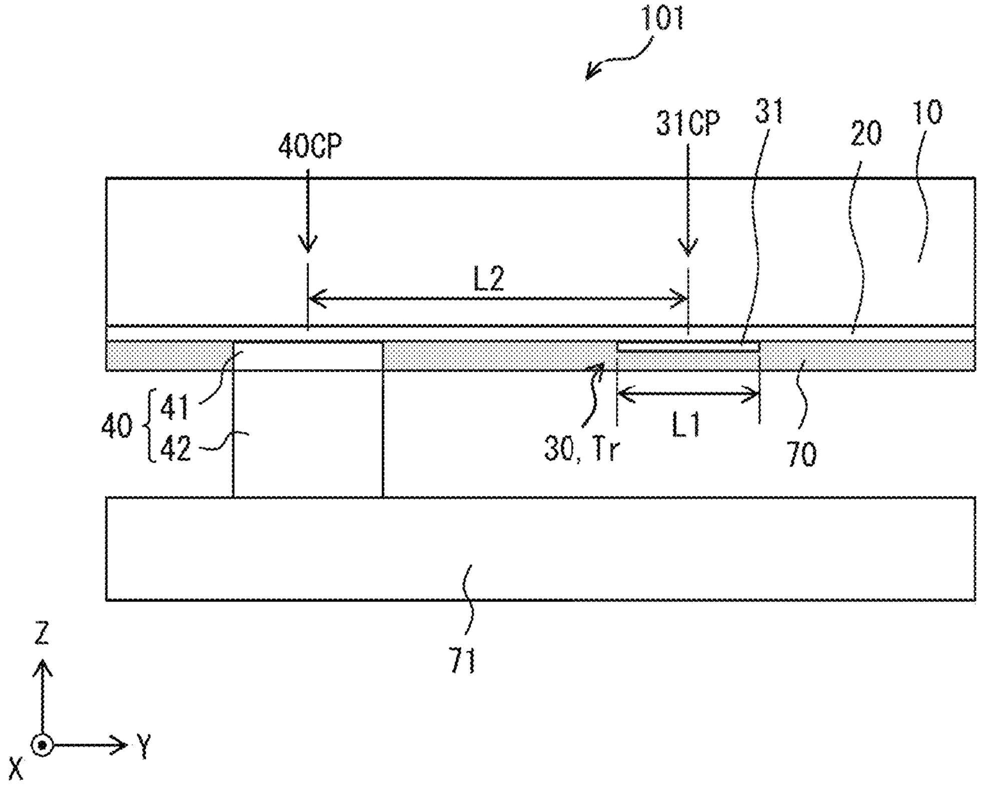

[ FIG. 5A ]
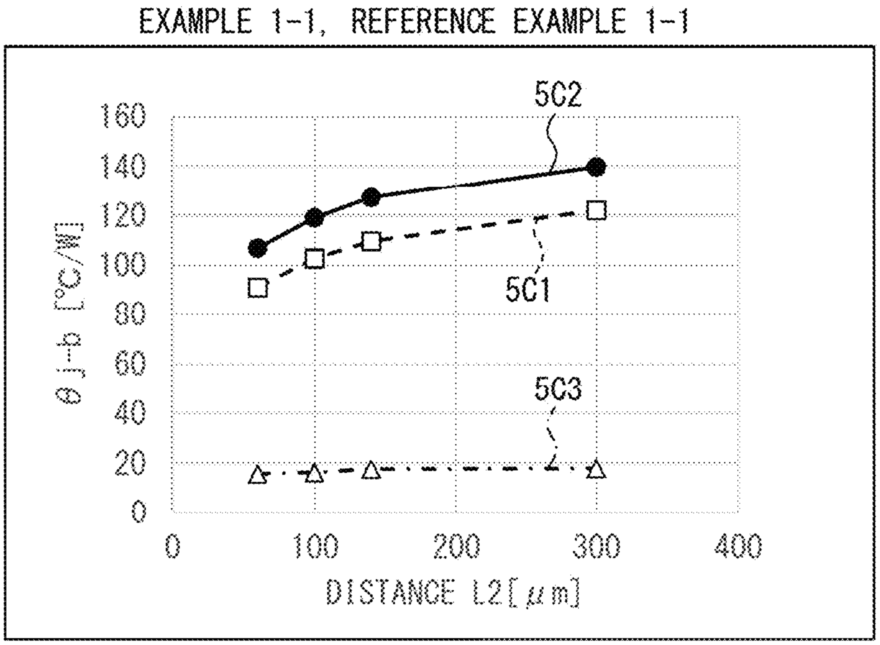
[ FIG. 5B ]
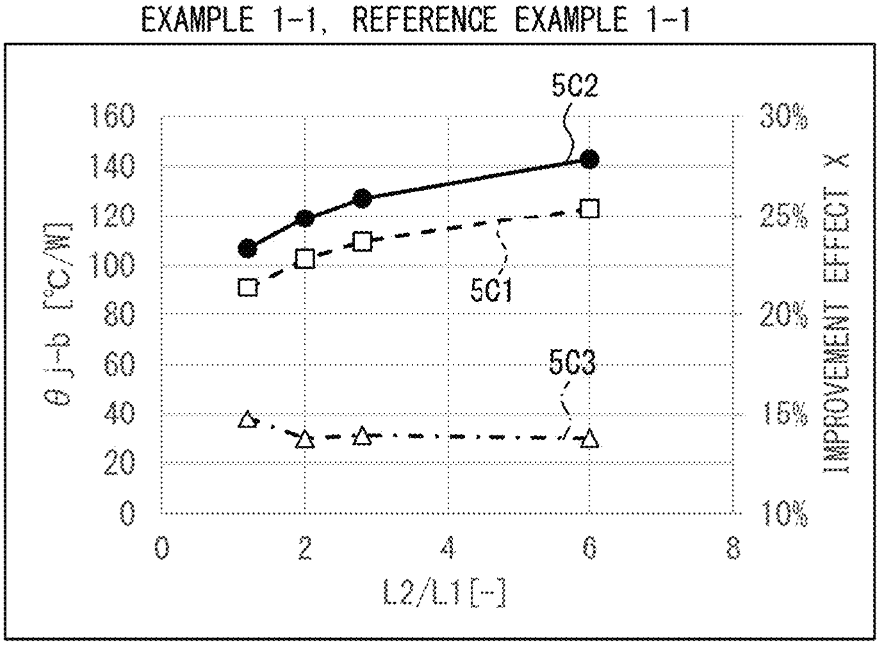

[ FIG. 6A ]
EXAMPLE 1-2, REFERENCE EXAMPLE 1-2
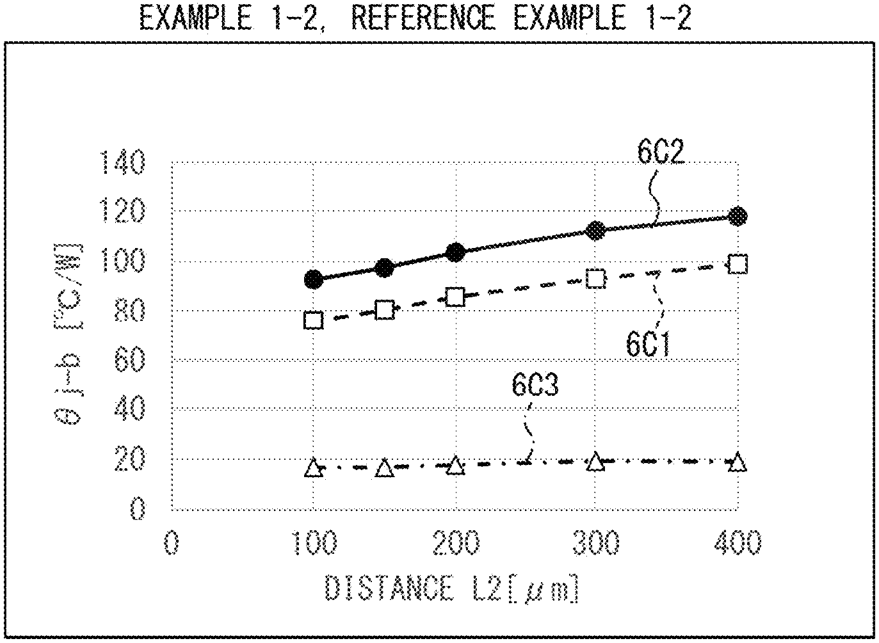
[ FIG. 6B ]
EXAMPLE 1-2, REFERENCE EXAMPLE 1-2
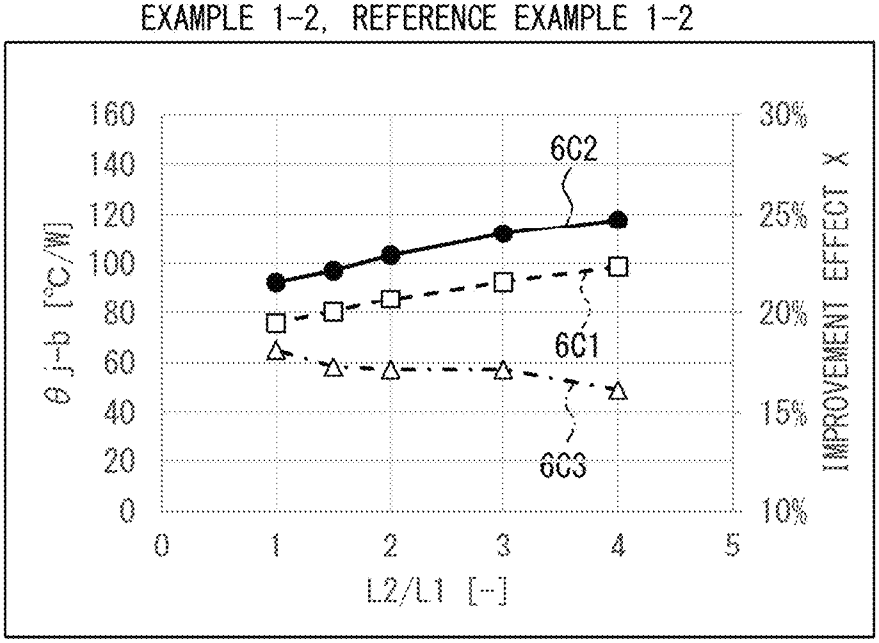

[ FIG. 7A ]
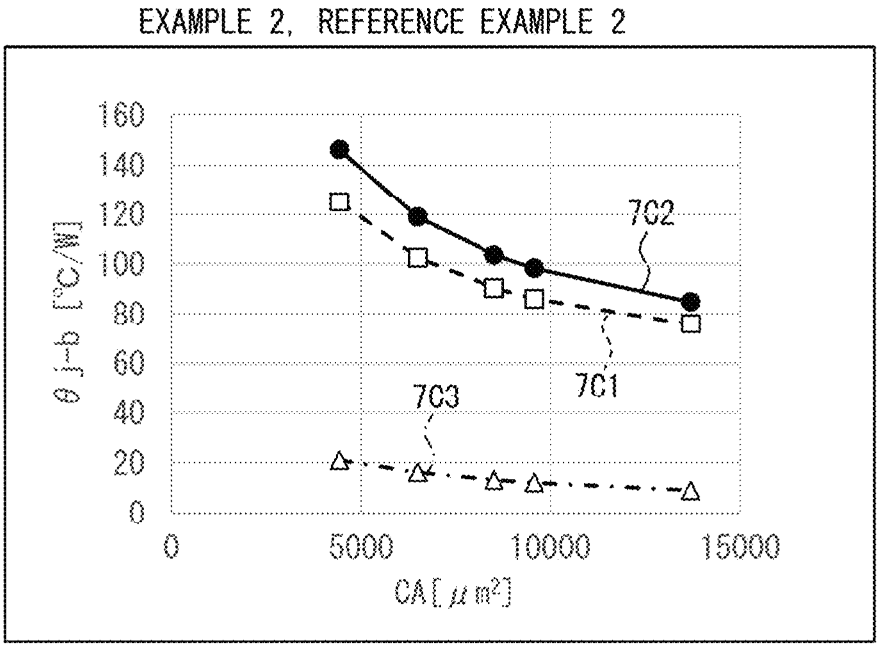
[ FIG. 7B ]
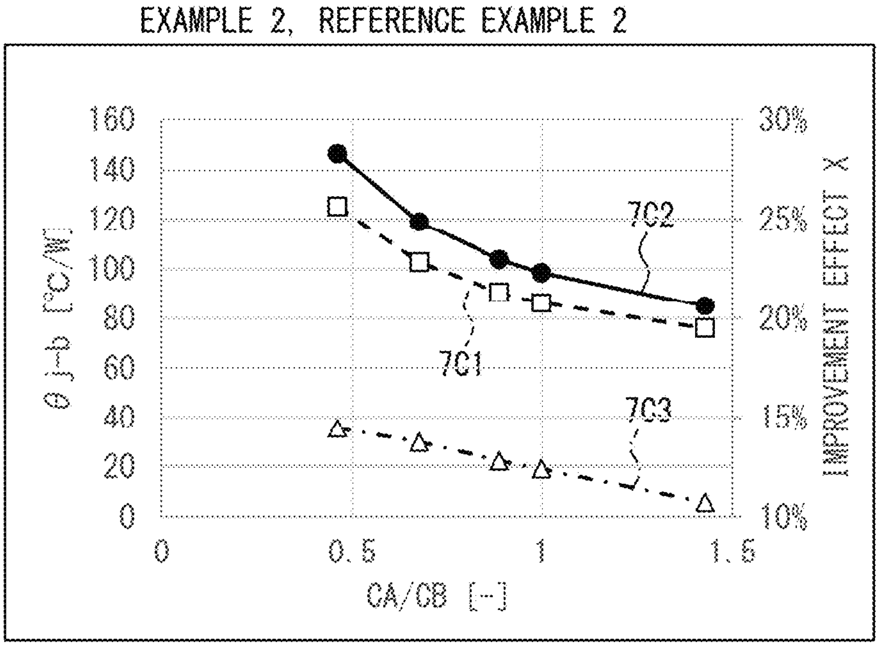

[ FIG. 8 ]
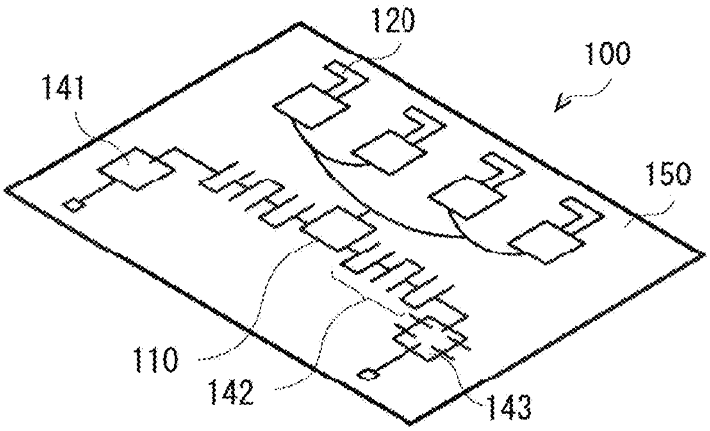
[ FIG. 9 ]
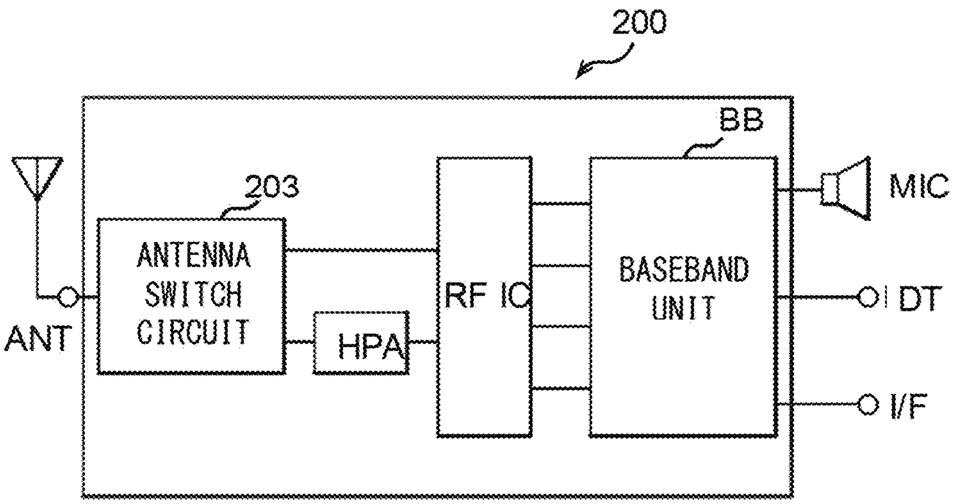

SEMICONDUCTOR DEVICE, SEMICONDUCTOR MODULE, AND WIRELESS COMMUNICATION APPARATUS

CROSS REFERENCE TO RELATED APPLICATIONS

This application is a U.S. National Phase of International Patent Application No. PCT/JP2022/012645 filed on Mar. 18, 2022, which claims priority benefit of Japanese Patent Application No. JP 2021-130331 filed in the Japan Patent Office on Aug. 6, 2021. Each of the above-referenced applications is hereby incorporated herein by reference in its entirety.

TECHNICAL FIELD

The present disclosure relates to a semiconductor device, a semiconductor module, and a wireless communication apparatus.

BACKGROUND ART

In recent years, a semiconductor device including an element having large power consumption, for example, a power amplifier circuit element or the like has been proposed (for example, refer to Patent Literature 1).

CITATION LIST

Patent Literature

PTL 1: Japanese Unexamined Patent Application Publication No. 2012-119469

SUMMARY OF THE INVENTION

By the way, in a case of such a high output semiconductor element such as a power amplifier, due to its relatively large power consumption, a calorific value caused by an operation of the high output semiconductor element increases. A case is assumed where an operation of a circuit including the high output semiconductor element is lowered when a temperature of the high output semiconductor element and a surrounding temperature increase.

Therefore, a semiconductor device having high heat dissipation and high operation reliability, and a semiconductor module and a wireless communication apparatus including the semiconductor device are desired.

A semiconductor device according to an embodiment of the present disclosure includes a semiconductor substrate, a first semiconductor layer that is provided on the semiconductor substrate, has a first aperture, and has a first thermal conductivity, a transistor provided on the first semiconductor layer, and a heat dissipation unit that is in contact with the semiconductor substrate via the first aperture and has a second thermal conductivity higher than the first thermal conductivity.

In the semiconductor device according to an embodiment of the present disclosure, the first aperture is provided in the first semiconductor layer where the transistor is provided, and the semiconductor substrate is in contact with the heat dissipation unit via the first aperture. Therefore, heat generated in the transistor is efficiently released outside.

BRIEF DESCRIPTION OF DRAWINGS

FIG. 1 is a laminated cross-sectional diagram illustrating a configuration of a semiconductor device according to an embodiment of the present disclosure.

FIG. 2 is a laminated cross-sectional diagram illustrating an enlarged portion of the semiconductor device illustrated in FIG. 1.

FIG. 3A is a plan view schematically illustrating an overall configuration of the semiconductor device according to an Example 1-1.

FIG. 3B is a cross-sectional diagram schematically illustrating the overall configuration of the semiconductor device illustrated in FIG. 3A.

FIG. 4 is a cross-sectional diagram schematically illustrating an overall configuration of a semiconductor device according to a Reference example 1-1.

FIG. 5A is a characteristic diagram illustrating a relation between a distance between a heat dissipation unit and a transistor integrated unit and a thermal resistance in the semiconductor devices according to the Example 1-1 and the Reference example 1-1.

FIG. 5B is a characteristic diagram illustrating a relation between a standardized distance between the heat dissipation unit and the transistor integrated unit and the thermal resistance in the semiconductor devices according to the Example 1-1 and the Reference example 1-1.

FIG. 6A is a characteristic diagram illustrating a relation between a distance between a heat dissipation unit and a transistor integrated unit and a thermal resistance in semiconductor devices according to an Example 1-2 and a Reference example 1-2.

FIG. 6B is a characteristic diagram illustrating a relation between a standardized distance between the heat dissipation unit and the transistor integrated unit and the thermal resistance in the semiconductor devices according to the Example 1-2 and the Reference example 1-2.

FIG. 7A is a characteristic diagram illustrating a relation between a contact region area and a thermal resistance in semiconductor devices according to an Example 2 and a Reference example 2.

FIG. 7B is a characteristic diagram illustrating a relation between a standardized contact region area and the thermal resistance in the semiconductor devices according to the Example 2 and the Reference example 2.

FIG. 8 is a schematic perspective view of a configuration of a semiconductor module.

FIG. 9 is a block diagram illustrating a configuration of a wireless communication apparatus.

MODES FOR CARRYING OUT THE INVENTION

Hereinafter, an embodiment of the present disclosure is described in detail with reference to the drawings. The embodiment described below is a specific example of the present disclosure, and a technique of the present disclosure is not limited to the following modes. In addition, the arrangement, dimensions, dimension ratios, and the like of components in the present disclosure are not limited to the mode illustrated in each drawing.

It is to be noted that the description is given in the following order.

0. Background
1. Embodiment (Example of Semiconductor Device Including HEMT)
   - 1-1. Configuration of Semiconductor Device
   - 1-2. Method for Manufacturing Semiconductor Device
   - 1-3. Workings and Effects of Semiconductor Device
2. Experimental Example
3. Example of Application
   - 3-1. Example of Application to Semiconductor Module
   - 3-2. Example of Application to Wireless Communication Apparatus 0. Background In recent years a high electron mobility transistor (HEMT) using a nitride semiconductor has been actively studied and developed. The nitride semiconductor has a larger band gap than Si, GaAs, or the like and has polarization specific to hexagonal crystals. Therefore, the HEMT using the nitride semiconductor is expected as a low-resistance high-withstand-voltage transistor that enables to perform a high-speed operation.

Specifically, application of the HEMT to, for example, a power device and a radio frequency (RF) device has been expected. For example, in base stations of satellite communications, wireless communications, or the like, practical use of a HEMT using AlGan for a barrier layer has been achieved.

By the way, for a semiconductor device used for the power device or the RF, in order to achieve high output and high efficiency, a transistor integrated unit called a multi-finger structure in which a plurality of transistor elements is arranged in parallel may be adopted. In the multi-finger structure, multiple finger portions respectively configuring gate electrodes of the plurality of transistor elements are arranged in parallel, and some of the multiple finger portions are coupled with a plurality of coupling portions, for example, in a winding manner.

However, a set of the plurality of finger portions often accumulates heat generated by the plurality of transistor elements and increases a temperature of the semiconductor device. There is a possibility that the increase in the temperature of the semiconductor device lowers a mobility of electrons, lowers a current amount, and lowers an output voltage. Therefore, as a technique for suppressing a temperature increase, a method is considered for using a material with high heat conductivity near a heat-producing portion or arranging a dummy bump to dissipate heat via the dummy bump.

However, in the future, it is expected that high integration is further requested in order to achieve higher output and higher efficiency.

Therefore, the applicant of the present application has studied to develop a semiconductor device that enables to more efficiently dissipate heat, and has created a semiconductor device with high heat dissipation and high operation reliability.

1. Embodiment 1-1. Configuration of Semiconductor Device

First, a configuration of a semiconductor device 1 according to an embodiment of the present disclosure is described with reference to FIG. 1. FIG. 1 is a vertical cross-sectional diagram illustrating a configuration example of the semiconductor device 1 according to the present embodiment. Note that the configuration of the semiconductor device 1 illustrated in FIG. 1 is an example, and a configuration of a semiconductor device according to the present disclosure is not limited to this.

As illustrated in FIG. 1, the semiconductor device 1 includes a substrate 10, a semiconductor layer 20, a transistor integrated unit 30, and a heat dissipation unit 40. The semiconductor device 1 includes a high electron mobility transistor (HEMT) using a two-dimensional electron gas layer 2DEG to be described layer as a channel. Here, as illustrated in FIG. 1, a plane parallel to a plane covered with each of the substrate 10 and the semiconductor layer 20 is set as an XY plane, and a direction perpendicular to the XY plane is set as a Z-axis direction. The Z-axis direction is a thickness direction of the substrate 10 and is also a thickness direction of the semiconductor layer 20. Furthermore, in the present embodiment, a direction in which a plurality of transistors Tr to be described later is arranged is set as an X-axis direction, and a direction in which each of a plurality of gate electrodes 31 to be described later extends is set as a Y-axis direction. The X-axis direction, the Y-axis direction, and the Z-axis direction are perpendicular to each other.

Substrate 10

The substrate 10 is a support of the semiconductor device 1. The substrate 10 is, for example, a silicon (Si) substrate, a silicon carbide (SiC) substrate, a sapphire substrate, a gallium nitride (GaN) substrate, or an aluminum nitride (AlN) substrate. As the Si substrate, for example, a single-crystal Si (111) substrate having a (111) plane as a principal surface is suitable.

Note that the substrate 10 using the above materials obtains effects of the semiconductor device according to the present disclosure to be described below. All Examples and Reference examples described later are results in a case where the substrate 10 including Si (111) is used. With the semiconductor device 1 using a substrate including SiC or a substrate including GaN that has a better single crystallinity and obtains a lower threading dislocation density than Si (111), it is possible to expect to further reduce an off-leak current and increase a voltage resistance. Therefore, it is sufficient to configure the substrate 10 by selecting a preferred material in accordance with use applications or the like.

Semiconductor Layer 20

The semiconductor layer 20 is laminated on the substrate 10. In a part of the semiconductor layer 20, an aperture 20K that passes through the semiconductor layer 20 in the thickness direction, that is, the Z-axis direction is provided. The semiconductor layer 20 has a laminated structure, in which a buffer layer 21, a channel layer 22, and a barrier layer 23 are laminated in order, for example. In the buffer layer 21, an aperture 21K that passes through the buffer layer 21 in its thickness direction is provided. In the channel layer 22, an aperture 22K that passes through the channel layer 22 in its thickness direction is provided. In the barrier layer 23, an aperture 23K that passes through the barrier layer 23 in its thickness direction is provided. These apertures 21K to 23K communicate with each other and configure the single aperture 20K. Note that another layer may be interposed between the buffer layer 21 and the channel layer 22, and another layer may be interposed between the channel layer 22 and the barrier layer 23. In addition, the semiconductor layer 20 may include another layer other than the buffer layer 21, the channel layer 22, and the barrier layer 23. Note that details of a configuration example of the semiconductor layer 20 is described later.

Transistor Integrated Unit 30

The transistor integrated unit 30 includes the plurality of transistors Tr. In the present embodiment, within a region along the XY plane of the semiconductor device 1, a region where the transistor integrated unit 30 is provided is referred to as an active region AR1, and a region other than the active region AR1 is referred to as a peripheral region AR2. The plurality of transistors Tr is provided on the semiconductor layer 20. The plurality of transistors Tr is arranged, for example, to be adjacent to each other in the X-axis direction and forms a so-called multi-finger structure. The transistor Tr includes, for example, a gate electrode 31, a source electrode 32, a drain electrode 33, a contact layer 34, a contact layer 35, and a wiring layer 36. Each of the gate electrode 31, the source electrode 32, the drain electrode 33, the contact layer 34, the contact layer 35, and the wiring layer 36 extends with the Y-axis direction as a longitudinal direction. The gate electrode 31 of each of the plurality of transistors Tr serves as a finger portion extending in the Y-axis direction, and the plurality of finger portions is coupled with each other with a plurality of coupling portions, for example, in a winding manner.

The contact layer 34 is couped to a lower surface of the source electrode 32, for example. The contact layer 35 is couped to a lower surface of the drain electrode 33, for example. The contact layers 34 and 35 lower a contact resistance with the two-dimensional electron gas layer 2DEG formed in the channel layer 22. It is preferable that the contact layers 34 and 35 include a semiconductor material having a band gap close to a band gap of a semiconductor material configuring the channel layer 22. The contact layers 34 and 35 are formed, for example, by crystal regrowth of a compound semiconductor. The contact layers 34 and 35 are formed, specifically, with a nitride semiconductor in which n-type impurities are introduced. For example, the contact layers 34 and 35 may be formed by introducing, for example, silicon (Si) or germanium (Ge) into an epitaxial growth layer of $Al_{1-x-y}In_xGa_yN$ ($0 \le x \le 1$, $0 \le y \le 1$, and $x+y \le 1$) to realize a concentration of greater than or equal to $1*1018/cm^3$.

The gate electrode 31 has a laminated structure, for example, formed by sequentially laminating a nickel (Ni) layer and a gold (Au) layer. The source electrode 32 and the drain electrode 33 have a laminated structure, for example, formed by sequentially laminating a titanium (Ti) layer, an aluminum (Al) layer, a nickel (Ni) layer, and a gold (Au) layer. An insulation film 51 is provided to cover the source electrode 32 and the drain electrode 33. An insulation film 52 is further provided on the insulation film 51. In addition, the insulation film 52 covers an inner surface of the aperture 20K provided in the peripheral region AR2 within the semiconductor layer 20. The insulation films 51 and 52 protect the source electrode 32 and the drain electrode 33.

In the insulation film 51, apertures are respectively provided at positions respectively overlapping the source electrode 32 and the drain electrode 33. The wiring layer 36 is provided in upper layers of the source electrode 32 and the drain electrode 33. The wiring layer 36 is electrically connected to each of an upper surface of the source electrode 32 and an upper surface of the drain electrode 33 via the apertures of the insulation film 51. The wiring layer 36 is formed, for example, by sequentially laminating a titanium (Ti) layer, a platinum (Pt) layer, and a gold (Au) layer, in order from the side of the substrate 10. It is preferable that a thickness of the wiring layer 36 be sufficiently thicker than both of a thickness of the source electrode 32 and a thickness of the drain electrode 33. That is, it is sufficient that a cross-sectional area of the wiring layer 36 be larger than both of a cross-sectional area of the source electrode 32 and a cross-sectional area of the drain electrode 33 on an XZ plane perpendicular to the Y-axis direction that is the longitudinal direction of the source electrode 32, the drain electrode 33, and the wiring layer 36. An outer surface of the wiring layer 36 is covered, for example, with an insulation film 53. The insulation film 53 is a passivation film that protects the wiring layer 36 and a wiring layer 41. The insulation film 53 is a single-layer film including silicon nitride (SiN), for example.

Heat Dissipation Unit 40

The heat dissipation unit 40 is in contact with the substrate 10 via the aperture 22K. A thermal conductivity of the heat dissipation unit 40 is higher than a thermal conductivity of the semiconductor layer 20. The heat dissipation unit 40 has a structure in which the wiring layer 41, a pillar 42, and a bump 43 are laminated on the substrate 10 in order, for example. The wiring layer 41 includes a material such as metal having higher heat conductivity than the thermal conductivity of the semiconductor layer 20. It is desirable that a thermal conductivity of each of the wiring layer 41, the pillar 42, and the bump 43 included in the heat dissipation unit 40 be higher than a thermal conductivity of each layer included in the semiconductor layer 20. The wiring layer 41 has, for example, a laminated structure same as the wiring layer 36. An outer surface of the wiring layer 41 is covered with the insulation film 53, for example. A bottom surface of the wiring layer 41 is in contact with the substrate 10 and forms a sub contact 27. The pillar 42 includes metal with high heat conductivity, for example, copper (Cu) or the like. The bump 43 is a metal plating film, for example, including a tin-silver alloy (SnAg) or the like. Furthermore, the heat dissipation unit 40 is electrically isolated from the transistor Tr of the transistor integrated unit 30. Furthermore, a thickness of the heat dissipation unit 40 is thicker than both of the thickness of the source electrode 32 and the thickness of the drain electrode 33. Furthermore, a volume of the heat dissipation unit 40 is larger than both of a volume of the source electrode 32 and a volume of the drain electrode 33.

Detailed Configuration of Semiconductor Layer 20

Next, a detailed configuration of the semiconductor layer 20 of the semiconductor device 1 is described with reference to FIG. 2. FIG. 2 is a vertical cross-sectional diagram illustrating an enlarged portion of the semiconductor device 1. Note that the configuration of the semiconductor layer 20 illustrated in FIG. 2 is an example, and a configuration of a semiconductor layer of the present disclosure is not limited to this.

As illustrated in FIG. 2, the semiconductor layer 20 has a laminated structure in which a first buffer layer 21A, a second buffer layer 21B, the channel layer 22, a spacer layer 24, the barrier layer 23, and a protection layer 25 are laminated on the substrate 10 in order. The first buffer layer 21A and the second buffer layer 21B configure the buffer layer 21. On the protection layer 25 of the semiconductor layer 20, the transistor integrated unit 30 is provided in which the plurality of transistors Tr each including the source electrode 32, the drain electrode 33, a gate insulation film Z, and the gate electrode 31 is arranged. The transistor Tr has, for example, a metal-insulator-semiconductor (MIS) type gate structure. Therefore, in the transistor Tr, for example, the gate electrode 31 is provided on the semiconductor layer 20 via the gate insulation film Z. Note that the gate structure of the present disclosure is not limited to the MIS type gate structure, and for example, may be a Schottky type gate structure in which the gate electrode 31 is directly connected with the semiconductor layer 20.

The semiconductor device 1 according to the present embodiment includes the high electron mobility transistor (HEMT) using the two-dimensional electron gas layer 2DEG as a channel. The two-dimensional electron gas layer 2DEG is generated due to a difference between a magnitude of polarization of the channel layer 22 and a magnitude of polarization of the barrier layer 23. The two-dimensional electron gas layer 2DEG is generated, for example, near an interface KS between the channel layer 22 and the spacer layer 24, within the channel layer 22.

The first buffer layer 21A and the second buffer layer 21B include, for example, an epitaxially grown nitride semiconductor. The first buffer layer 21A and the second buffer layer 21B enable to relax lattice mismatch between the substrate 10 and the channel layer 22, by controlling a lattice constant of a surface where the channel layer 22 is provided. Therefore, the first buffer layer 21A and the second buffer layer 21B enable to further improve a crystal condition of the channel layer 22 and prevent warpage of the substrate 10.

For example, in a case where the substrate 10 is a single-crystal Si substrate of which a principal surface is the (111) plane and the channel layer 22 is a GaN layer, the first buffer layer 21A may include AlN, and the second buffer layer 21B may include AlGaN. However, depending on the configurations of the substrate 10 and the channel layer 22, both of the first buffer layer 21A and the second buffer layer 21B do not need to exist. Alternatively, only the first buffer layer 21A out of the first buffer layer 21A and the second buffer layer 21B may be provided.

The channel layer 22 is provided on the second buffer layer 21B. The channel layer 22 includes, for example, a nitride semiconductor having a band gap smaller than a band gap of the spacer layer 24 and a band gap of the barrier layer 23. The channel layer 22 enables to accumulate carriers in an interface on the side of the barrier layer 23, in accordance with the difference between the magnitude of the polarization of the channel layer 22 and the magnitude of the polarization of the barrier layer 23. The channel layer 22 includes, for example, a group III-V semiconductor.

Specifically, the channel layer 22 may include $Al_{x5}In_{y5}Ga_{(1-x5-y5)}N$ ($0 \le x5 \le 1, 0 \le y5 \le 1, 0 \le x5+y5 \le 1$) that is an epitaxially grown nitride semiconductor. For example, the channel layer 22 includes epitaxially grown gallium nitride (GaN). Alternatively, the channel layer 22 may include at least one type of indium gallium nitride (InGaN), indium nitride (InN), aluminum gallium nitride (AlGaN), and aluminum indium gallium nitride (AlInGaN). More specifically, the channel layer 22 may include undoped u-GaN to which impurities are not added. In that case, the channel layer 22 enables to prevent carrier impurity scattering. Therefore, the channel layer 22 enables to further enhance mobility of the carrier.

The spacer layer 24 includes, for example, a nitride semiconductor having a band gap larger than the band gap of the channel layer 22. The spacer layer 24 is provided on the channel layer 22. The spacer layer 24 reduces alloy scattering between the barrier layer 23 and the channel layer 22 and prevents deterioration in the carrier mobility of the two-dimensional electron gas layer 2DEG due to the alloy scattering.

Specifically, the spacer layer 24 may include epitaxially grown $Al_{x1}In_{y1}Ga_{(1-x1-y1)}N$ ($0 < x1 \le 1, 0 \le y1 < 1, 0 \le x1+y1 \le 1$). For example, the spacer layer 24 may include AlN, or may include AlGaN or AlInGaN.

The barrier layer 23 includes, for example, a nitride semiconductor having a band gap larger than the band gap of the channel layer 22. The barrier layer 23 is provided on the spacer layer 24. The barrier layer 23 enables to accumulate carriers in a region near the barrier layer 23 within the channel layer 22 by spontaneous polarization and piezoelectric polarization. As a result, in the semiconductor device 1, in a region near the interface KS within the channel layer 22, it is possible to form the two-dimensional electron gas layer 2DEG with high mobility and high carrier concentration.

Specifically, the barrier layer 23 includes $Al_{x3}In_{y3}Ga_{(1-x3-y3)}N$ ($x2 < x3 < 1, 0 \le y3 < 1$) that is an epitaxially grown nitride semiconductor. Here, $x3 > 0.7$ and $y3 < 0.3$ may be satisfied. For example, the barrier layer 23 may include undoped u-$Al_{x3}In_{(1-x3)}N$ to which impurities are not added. In such a case, it is possible to reduce lattice mismatch with GaN in the barrier layer 23, and this makes it possible to obtain a crystal with excellent single crystallinity.

In a case where a composition ratio of Al of the barrier layer 23 is high, in particular, the barrier layer 23 is likely to be oxidized. In order to prevent such oxidization, it is preferable to provide the protection layer 25 on the barrier layer 23. The protection layer 25 protects a surface of the barrier layer 23 from impurities such as chemicals or various ions and maintains the surface of the barrier layer 23 to be excellent to make it possible to prevent deterioration in operation characteristics of the semiconductor device 1. The protection layer 25 includes, for example, $Al_{x4}In_{y4}Ga_{(1-x4-y4)}N$ ($0 \le x4 < 1, 0 \le y4 < 1$) that is an epitaxially grown nitride semiconductor. Note that, in a relation with the nitride semiconductor included in the barrier layer 23, it is preferable to satisfy $(1-x3-y3) < (1-x4-y4)$. Therefore, the protection layer 25 includes, for example, GaN. The protection layer 25 may include AlInGaN, AlGaN, or InGaN. GaN has the highest single crystallinity. InGaN easily has n-type contact. Regarding AlInGaN and AlGaN, by selecting a composition with a lower Al composition than the barrier layer 23, it is possible to obtain a mixed crystal having a larger band gap than GaN and InGaN while performing a function as a protection layer. Having a large band gap is advantageous to obtain a high two-dimensional electron gas concentration. In a case where there is no concern about the characteristics due to the oxidization of the barrier layer 23, the protection layer 25 does not need to exist.

As described above, all of the gate electrode 31, the source electrode 32, and the drain electrode 33 include conductive materials. All of the gate electrode 31, the source electrode 32, and the drain electrode 33 are provided on the semiconductor layer 20. The gate electrode 31 is arranged between the source electrode 32 and the drain electrode 33. The gate electrode 31 is provided on the protection layer 25, via the gate insulation film Z. Note that the gate electrode 31 may form schottky junction by contacting with the nitride semiconductor configuring the protection layer 25 without via the gate insulation film Z.

The gate insulation film Z includes an insulating material. The gate insulation film Z is provided to cover a region that is not covered with any one of the gate electrode 31, the source electrode 32, and the drain electrode 33, within the region on the protection layer 25. A configuration material of the gate insulation film Z is, for example, aluminum oxide ($Al_2O_3$), silicon dioxide ($SiO_2$), silicon nitride ($Si_3N_4$), hafnium oxide ($HfO_2$), or the like. The gate insulation film Z may be a single-layer film including the configuration material described above or may be a multi-layer film in which a plurality of layers including the above-described configuration material is laminated.

1-2. Method for Manufacturing Semiconductor Device

Next, an example of a method for manufacturing the semiconductor device 1 according to the present embodiment is described with reference to FIGS. 1 and 2.

First, the substrate 10 is prepared, and then, the semiconductor layer 20 is formed thereon. Specifically, as illustrated in FIG. 2, for example, on the substrate 10, the first buffer layer 21A, the second buffer layer 21B, the channel layer 22, the spacer layer 24, the barrier layer 23, and the protection layer 25 are sequentially epitaxially grown.

Next, the transistor integrated unit 30 is formed on the semiconductor layer 20. Specifically, first, a region, within the semiconductor layer 20, where the contact layers 34 and 35 should be formed is selectively etched to dig into a predetermined depth. Subsequently, by forming the nitride semiconductor in the selectively etched portion through epitaxial growth, the contact layers 34 and 35 are obtained. Subsequently, the source electrode 32 and the drain electrode 33 are respectively formed to cover the contact layers 34 and 35. Moreover, the insulation film 51 (FIG. 1) that covers the source electrode 32 and the drain electrode 33 is formed. Next, after forming the gate insulation film Z (FIG. 2), the gate electrode 31 is further formed on the gate insulation film Z. As described above, the transistor integrated unit 30 is formed.

Subsequently, as illustrated in FIG. 1, by selectively removing a part of the semiconductor layer 20 in the peripheral region AR2, the aperture 20K is formed. It is possible to form the aperture 20K, for example, by dry etching. By forming the aperture 20K, an upper surface of the substrate 10 is exposed. Next, the insulation film 52 is formed over an entire surface, to cover the aperture 20K and the transistor integrated unit 30. Subsequently, by selectively removing a part of the insulation film 52 that covers the substrate 10 positioned at the bottom surface of the aperture 20K, for example, by dry etching, an aperture 52K is formed. As a result, the substrate 10 is exposed again. At the same time as the formation of the aperture 52K, a part of the insulation film 52 that covers the source electrode 32 and the drain electrode 33 is also selectively removed.

Subsequently, for example, by sequentially laminating a titanium (Ti) layer, a platinum (Pt) layer, and a gold (Au) layer to fill the aperture 52K, the wiring layer 41 is formed. As a result, the sub contact 27 in which the wiring layer 41 and the substrate 10 are coupled is formed. It is desirable that no insulation film such as an oxidized film do not exist in the interface between the wiring layer 41 and the substrate 10. Furthermore, at the same time as the formation of the wiring layer 41, the wiring layer 36 coupled to each of the source electrode 32 and the drain electrode 33 is formed.

After forming the wiring layers 41 and 36, the insulation film 53 is formed to cover the outer surfaces of the wiring layers 41 and 36. Thereafter, by selectively removing a part of the insulation film 53 that covers the wiring layer 41, an aperture 53K is formed. On the wiring layer 41 exposed in the aperture 53K, for example, the pillar 42 including copper (Cu) and, for example, the bump 43 including a tin-silver alloy (SnAg) are selectively formed in order, for example, by a plating process. As a result, the heat dissipation unit 40 is completed.

Through the above process, it is possible to form the semiconductor device 1 according to the present embodiment.

1-3. Workings and Effects of Semiconductor Device

As described above, in the semiconductor device 1 according to the present embodiment, the transistor integrated unit 30 is formed in the active region AR1 of the semiconductor layer 20 provided on the substrate 10, and the heat dissipation unit 40 is provided in the peripheral region AR2 of the semiconductor layer 20. The heat dissipation unit 40 is in contact with the substrate 10 via the aperture 20K of the semiconductor layer 20 and forms the sub contact 27. Moreover, the thermal conductivity of the heat dissipation unit 40 is higher than the thermal conductivity of the semiconductor layer 20. Therefore, as compared with a case where the substrate 10 and the heat dissipation unit 40 are blocked by the semiconductor layer 20, heat generated in the transistor integrated unit 30 is efficiently released to the outside via the heat dissipation unit 40. As a result, it is possible for the semiconductor device 1 to effectively suppress an increase in the temperature at the time of operation.

As a result, the semiconductor device 1 has high heat dissipation and high operation reliability, and this makes it possible for the semiconductor device 1 to be more highly integrated.

2. Experimental Example

Example 1-1

A thermal resistance of the semiconductor device 1 illustrated in FIG. 1 was studied. Specifically, regarding the semiconductor device 1 illustrated in FIGS. 3A and 3B, a thermal resistance θj-b of the semiconductor device 1 when the transistor integrated unit 30 produces heat was obtained by a simulation. FIG. 3A is a plan view schematically illustrating an overall configuration of the semiconductor device 1 according to the present example, and FIG. 3B is a cross-sectional diagram schematically illustrating the overall configuration of the semiconductor device 1 according to the present example. Here, silicon (Si) with a thickness of 200 μm was assumed as the substrate 10, and the thermal conductivity was set to 148 W/mK. Furthermore, a thickness of the overall semiconductor layer 20 was set to two μm, and a thermal conductivity of the overall semiconductor layer 20 was set to 40 W/mK. Furthermore, the heat dissipation unit 40 included only the wiring layer 41 and the pillar 42. The aperture 20K was filled with the wiring layer 41 including titanium (Ti) and was brought into contact with the substrate 10 to allow to form the sub contact 27. Moreover, on a side of the pillar 42 opposite to the substrate 10, a heat block 71 was disposed. The heat block 71 and the wiring layer 41 were coupled by the pillar 42, and the heat of the semiconductor device 1 was released to the heat block 71 via the pillar 42. A protection film 70 including SiN was provided to cover a region other than the heat dissipation unit 40. A thermal conductivity of the protection film 70 was set to 20 W/mK.

Furthermore, it was assumed that, in the semiconductor device 1 according to the present example, the transistor integrated unit 30 include 30 transistors Tr arranged in the X-axis direction. Specifically, it was assumed that the gate electrodes 31 that extend in the Y-axis direction and have the finger length L1 of 50 μm be arranged in the Y-axis direction at an arrangement pitch of 6.4 μm. Furthermore, an ohmic length was set to five μm. An ambient temperature was set to 25° C., and a thermal resistance between the heat block 71 and an atmosphere was set to 137 K/W. Furthermore, in the present example, a distance L2 in the Y-axis direction between a center position 40CP of the heat dissipation unit 40 and a center position 31CP of the gate electrode 31 was set to each of four levels including 60, 100, 140, and 300 μm, and a thermal resistance was calculated. Moreover, an area of a region of the sub contact 27 where the wiring layer 41 is in contact with the substrate 10, that is, a contact region area CA was set to 4,900 μm$^2$. Furthermore, as illustrated in FIG. 3A, on the XY plane, the center position of the sub contact 27 and the center position of the transistor integrated unit 30 matched in the Y-axis direction. Furthermore, in the present example, a calorific value of the transistor integrated unit 30 was set to 0.5 W.

Furthermore, the thermal resistance θj-b was calculated in accordance with the following formula (1).

$$(\theta j-b)=\{(TF_{max})-(TH_{max})\}/Cv \quad (1)$$

Here, $TF_{max}$ represents a highest temperature of a finger included in the gate electrode 31, $TH_{max}$ represents a highest temperature of the heat block 71, and Cv represents the calorific value of the transistor integrated unit 30.

Reference Example 1-1

For comparison, a thermal resistance of a semiconductor device 101 as a Reference example 1-1 was studied. In the semiconductor device 101 as the Reference example 1-1, as illustrated in FIG. 4, the semiconductor layer 20 does not have the aperture 20K, and the wiring layer 41 of the heat dissipation unit 40 and the substrate 10 are blocked and separated by the semiconductor layer 20. In this way, except for that the semiconductor device 101 does not include the sub contact 27, the semiconductor device 101 has the configuration same as the semiconductor device 1 of the Example 1-1.

Regarding the semiconductor device 1 illustrated in FIGS. 3A and 3B and the semiconductor device 101 illustrated in FIG. 4, the thermal resistance θj-b when the transistor integrated unit 30 produces heat was obtained by a simulation. As a propagation path of the heat generated in the transistor integrated unit 30, for example, as illustrated in FIG. 3B, three paths are mainly considered. That is, a path P1 from the gate electrode 31 to the wiring layer 41 of the heat dissipation unit 40 via the protection film 70, a path P2 from the gate electrode 31 to the wiring layer 41 of the heat dissipation unit 40 via the semiconductor layer 20, and a path P3 from the gate electrode 31 to the wiring layer 41 of the heat dissipation unit 40 via the semiconductor layer 20 and the substrate 10 are considered.

FIG. 5A illustrates a relation between the distance L2 and the thermal resistance θj-b. In FIG. 5A, the horizontal axis represents the distance L2 [μm], and the vertical axis represents the thermal resistance θj-b [° C./W]. In FIG. 5A, a curved line 5C1 represents a thermal resistance θj-b in the Example 1-1, a curved line 5C2 represents a thermal resistance θj-b in the Reference example 1-1, and a curved line 5C3 represents a difference between the thermal resistance θj-b in the Example 1-1 and the thermal resistance θj-b in the Reference example 1-1. As illustrated in FIG. 5A, in a case where the distance L2 is the same, the thermal resistance θj-b in the Example 1-1 was lower than that in the Reference example 1-1. That is, it was possible to confirm that the semiconductor device 1 according to the Example 1-1 having the sub contact 27 in which the heat dissipation unit 40 is in contact with the substrate 10 has higher heat dissipation than the semiconductor device 101 according to the Reference example 1-1 in which the heat dissipation unit 40 is separated from the substrate 10 by the semiconductor layer 20. It is considered that one reason for this is that, in the semiconductor device 1 according to the Example 1-1, heat propagation through the path P3 (FIG. 3B) is more satisfactorily performed than the semiconductor device 101 according to the Reference example 1-1. However, the difference between the thermal resistance θj-b in the Example 1-1 and the thermal resistance θj-b in the Reference example 1-1 was substantially constant, without depending on the distance L2 (refer to curved line 5C3).

Here, in FIG. 5B, a relation between a value obtained by standardizing the distance L2 with the finger length L1 (=50 μm) and the thermal resistance θj-b is illustrated. In FIG. 5B, the horizontal axis represents (distance) L2/(finger length) L1 [−], and the vertical axis on the left side represents the thermal resistance θj-b [° C./W]. Furthermore, in FIG. 5B, with reference to the thermal resistance θj-b of the semiconductor device 101 according to the Reference example 1-1, an improvement effect X [%] was indicated by the vertical axis on the right side in FIG. 5B, as an index representing how much the thermal resistance θj-b of the semiconductor device 1 according to the Example 1-1 was lowered. In FIG. 5B, the curved line 5C3 represents a relation between L2/L1 [−] and the improvement effect X [%]. As illustrated in FIG. 5B, it was found that a higher improvement effect X [%] is obtained in a case where L2/L1 [−] is less than or equal to two. That is, it was possible to confirm that, if the heat dissipation unit 40 is arranged near the transistor integrated unit 30 to cause L2/L1 [−] to be less than or equal to two, a higher heat dissipation effect is obtained.

Example 1-2

Next, the thermal resistance θj-b was evaluated as in the Example 1-1 under conditions similar to the Example 1-1, except that the finger length L1 was set to 100 μm and the arrangement pitch of the gate electrodes 31 was set to 11.4 μm.

Reference Example 1-2

The thermal resistance θj-b was evaluated as in the Reference example 1-1 under conditions similar to the Reference example 1-1, except that the finger length L1 was set to 100 μm and the arrangement pitch of the gate electrodes 31 was set to 11.4 μm, In FIGS. 6A and 6B, evaluation results of the thermal resistances θj-b in the Example 1-2 and the Reference example 1-2 are illustrated. FIGS. 6A and 6B are diagrams respectively corresponding to FIGS. 5A and 5B. In FIG. 6A, the horizontal axis represents the distance L2 [μm], and the vertical axis represents the thermal resistance θj-b [° C./W]. In FIG. 6A, a curved line 6C1 represents the thermal resistance θj-b in the Example 1-2, a curved line 6C2 represents the thermal resistance θj-b in the Reference example 1-2, and a curved line 6C3 represents a difference between the thermal resistance θj-b in the Example 1-2 and the thermal resistance θj-b in the Reference example 1-2. As illustrated in FIG. 6A, in a case where the distance L2 is the same, the thermal resistance θj-b in the Example 1-2 was lower than that in the Reference example 1-2. However, the difference between the thermal resistance θj-b in the Example 1-2 and the thermal resistance θj-b in the Reference example 1-2 was substantially constant, without depending on the distance L2 (refer to curved line 6C3). That is, the Example 1-2 and the Reference example 1-2 indicated substantially similar tendency to the tendency of the Example 1-1 and the Reference example 1-1. In FIG. 6B, the horizontal axis represents (distance) L2/(finger length) L1 [−], and the vertical axis on the left side represents the thermal resistance θj-b [° C./W]. Furthermore, in FIG. 6B, with reference to the thermal resistance θj-b of the semiconductor device 101 according to the Reference example 1-2, the improvement effect X [%] was indicated by the vertical axis on the right side in FIG. 6B, as an index representing how much the thermal resistance θj-b of the semiconductor device 1 according to the Example 1-2 was lowered. In FIG. 6B, the curved line 6C3 represents a relation between L2/L1 [−] and the improvement effect X [%]. As illustrated in FIG. 6B, it was also found that a higher improvement effect X [%] is obtained in a case where L2/L1 [−] is less than or equal to two. That is, it was possible to confirm that, if the heat dissipation unit 40 is arranged near the transistor integrated unit 30 to cause the following condition expression (A) to be satisfied, a higher heat dissipation effect is obtained.

$$(L2/L1)\leq 2 \qquad \text{(A)}$$

Note that it is preferable that the finger length L1 be, for example, longer than or equal to 25 μm and shorter than or equal to 200 μm.

Example 2

Next, regarding the semiconductor device 1 illustrated in FIGS. 3A and 3B, how the thermal resistance θj-b of the semiconductor device 1 when the transistor integrated unit 30 produces heat changes depending on the contact region area CA between the wiring layer 41 and the substrate 10 in the sub contact 27 was obtained by a simulation. In the present example, the distance L2 was set to 100 μm. Furthermore, in the present example, the contact region area CA was set to each of five levels including 4,400, 6,400, 8,400, 9,400, and 14,400 $\mu m^2$, and a thermal resistance was calculated. Note that other configurations such as the configuration of the transistor integrated unit 30 were set to be similar to those in the Example 1-1.

Reference Example 2

For comparison, a thermal resistance of the semiconductor device 101 as a Reference example 2 has been studied. The semiconductor device 101 as the Reference example 2 has the same configuration as the semiconductor device 1 according to the Example 2 except that the semiconductor device 101 does not include the sub contact 27.

In FIG. 7A, a relation between the contact region area CA and the thermal resistance θj-b is illustrated. In FIG. 7A, the horizontal axis represents the contact region area CA [$\mu m^2$], and the vertical axis represents the thermal resistance θj-b [° C./W]. In FIG. 7A, a curved line 7C1 represents a thermal resistance θj-b in the Example 2, a curved line 7C2 represents a thermal resistance θj-b in the Reference example 2, and a curved line 7C3 represents a difference between the thermal resistance θj-b in the Example 2 and the thermal resistance θj-b in the Reference example 2. As illustrated in FIG. 7A, in a case where the contact region area CA is the same, the thermal resistance θj-b in the Example 2 was lower than that in the Reference example 2. That is, it was possible to confirm that the semiconductor device 1 according to the Example 2 including the sub contact 27 in which the heat dissipation unit 40 is in contact with the substrate 10 has higher heat dissipation than the semiconductor device 101 according to the Reference example 2 in which the heat dissipation unit 40 is separated from the substrate 10 by the semiconductor layer 20. Furthermore, as the contact region area CA was smaller, the difference between the thermal resistance θj-b in the Example 2 and the thermal resistance θj-b in the Reference example 2 tended to be larger (refer to curved line 7C3). It is considered that one reason for this is that, heat is more effectively released in a portion, in the sub contact 27, at a position closer to the transistor integrated unit 30.

Here, in FIG. 7B, a relation between a value obtained by standardizing the contact region area CA with an area CB of the transistor integrated unit 30 (referred to as FET area below) and the thermal resistance θj-b is illustrated. The FET area CB is defined by (finger length L1)*(the number of fingers)*(arrangement pitch of fingers). Specifically, (FET area) CB=50 μm*30*6.4 μm=9,600 [$\mu m^2$]. In FIG. 7B, the horizontal axis represents (contact region area) CA/(FET area) CB [−], and the vertical axis on the left side represents the thermal resistance θj-b [° C./W]. Furthermore, in FIG. 7B, with reference to the thermal resistance θj-b of the semiconductor device 101 according to the Reference example 2, an improvement effect X [%] was indicated by the vertical axis on the right side in FIG. 7B as an index representing how much the thermal resistance θj-b of the semiconductor device 1 according to the Example 2 was lowered. In FIG. 7B, the curved line 7C3 represents a relation between CA/CB [−] and the improvement effect X [%]. As illustrated in FIG. 7B, it was found that a higher improvement effect X [%] is obtained as CA/CB [−] is smaller. From this, it was found that it is possible to effectively release heat by arranging the sub contact 27 at a position close to the transistor integrated unit 30 as possible even if the contact region area CA is small.

3. Example of Application

3-1. Semiconductor Module

Subsequently, a semiconductor module that is a first application example of the technique of the present disclosure is described with reference to FIG. 8. FIG. 8 is a schematic perspective view of a configuration of a semiconductor module 100.

As illustrated in FIG. 8, the semiconductor module 100 is an antenna-integrated module, for example, in which an edge antenna 120 and a plurality of front-end components are mounted on a single chip 50 as a module. The plurality of edge antennae 120 is formed, for example, on the chip 50 in an array. The front-end component is, for example, a switch 110, a low noise amplifier 141, a bandpass filter 142, a power amplifier 143, or the like. For example, the semiconductor module 100 may be used as a transceiver for wireless communication.

The semiconductor module 100 includes the semiconductor device 1 according to the present embodiment, for example, as a transistor configuring the switch 110, the low noise amplifier 141, the power amplifier 143, or the like. For example, in the 5th generation mobile communication system (5G) using radio waves in a higher frequency band, a radio wave propagation loss is large. Therefore, it is desirable for the semiconductor module 100 conforming to the 5G to transmit radio waves with higher electric power. As it is possible for the semiconductor module 100 including the semiconductor device 1 according to the present embodiment to improve device characteristics, it is possible to perform wireless communication with high output, low power consumption, and high reliability. That is, it is possible to use the semiconductor module 100 for the 5th generation mobile communication system (5G) more preferably.

3-2. Wireless Communication Apparatus

Next, a wireless communication apparatus that is a second application example of the technique of the present disclosure is described with reference to FIG. 9. FIG. 9 is a block diagram illustrating a configuration of a wireless communication apparatus 200.

As illustrated in FIG. 9, the wireless communication apparatus 200 includes an antenna ANT, an antenna switch circuit 203, a high power amplifier HPA, a high frequency integrated circuit radio frequency integrated circuit (RFIC), a baseband unit BB, a voice output unit MIC, a data output unit DT, and an interface unit I/F (for example, wireless local area network (W-LAN), Bluetooth (registered trademark), or the like). The wireless communication apparatus 200 is a mobile phone system that has multiple functions, for example, voice and data communication, LAN connection, or the like.

At the time of transmission, in the wireless communication apparatus 200, a transmission signal is transmitted from the baseband unit BB to the antenna ANT via the high frequency integrated circuit RFIC, the high-power amplifier HPA, and the antenna switch circuit 203. Furthermore, in the wireless communication apparatus 200, at the time of reception, a reception signal is inputted from the antenna ANT to the baseband unit BB via the antenna switch circuit 3 and the high frequency integrated circuit RFIC. The reception signal processed by the baseband unit BB is outputted, for example, from the voice output unit MIC, the data output unit DT, or the interface unit I/F to outside the wireless communication apparatus 2.

The wireless communication apparatus 200 includes the semiconductor device 1 according to the present embodiment, as a transistor configuring the antenna switch circuit 203, the high-power amplifier HPA, the high frequency integrated circuit RFIC, the baseband unit BB, or the like. This makes it possible for the wireless communication apparatus 200 to further improve the device characteristics, and therefore, it is possible to perform wireless communication with high output, low power consumption, and high reliability.

The technique of the present disclosure has been described above with reference to the embodiments and the modification examples. However, the technique of the present disclosure is not limited to the above-described embodiments and the like, and is modifiable in a variety of ways.

In addition, not all of the configurations and the operations described in the embodiments are indispensable as the configurations and the operations of the present disclosure. For example, among the components of the embodiments, any component that is not recited in an independent claim which represents the most generic concept of the present disclosure is to be understood as an optional component.

Terms used throughout this specification and the appended claims should be construed as "non-limiting" terms. For example, the term "including" or "included" should be construed as "not limited to what is described as being included". The term "having" should be construed as "not limited to what is described as being had".

The terms used herein include terms that are used merely for convenience of description and that are not used to limit the configuration and the operation. For example, the terms such as "right", "left", "upper", and "lower" only indicate directions in the drawings being referred to.

It is to be noted that the technique of the present disclosure may have the following configurations. According to the technique of the present disclosure having the following configurations, a first aperture is provided in a first semiconductor layer where a transistor is provided, and a semiconductor substrate is in contact with a heat dissipation unit via the first aperture. Therefore, heat generated in the transistor is efficiently released outside. As a result, the semiconductor device according to the present disclosure has high heat dissipation and high operation reliability, and this makes it possible for the semiconductor device to be more highly integrated.

The effect achieved by the technique of the present disclosure is not necessarily limited to the effects described herein and may be any effect described in the present disclosure.

(1)

A semiconductor device including:
- a semiconductor substrate;
- a first semiconductor layer that is provided on the semiconductor substrate, has a first aperture, and has a first thermal conductivity;
- a transistor provided on the first semiconductor layer; and
- a heat dissipation unit that is in contact with the semiconductor substrate via the first aperture and has a second thermal conductivity higher than the first thermal conductivity.

(2)

The semiconductor device according to (1), in which the heat dissipation unit includes metal.

(3)

The semiconductor device according to (1) or (2), in which the heat dissipation unit is electrically isolated from the transistor.

(4)

The semiconductor device according to any one of (1) to (3), in which
- the transistor includes a source electrode and a drain electrode, and
- a thickness of the heat dissipation unit is thicker than both of a thickness of the source electrode and a thickness of the drain electrode.

(5)

The semiconductor device according to any one of (1) to (4), in which
- the transistor includes a source electrode and a drain electrode, and
- a volume of the heat dissipation unit is larger than both of a volume of the source electrode and a volume of the drain electrode.

(6)

The semiconductor device according to any one of (1) to (5), in which the first semiconductor layer includes a group III-V semiconductor.

(7)

The semiconductor device according to (6), in which the group III-V semiconductor includes gallium nitride (GaN).

(8)

The semiconductor device according to any one of (1) to (3), further including a second semiconductor layer that is provided on an opposite side to the semiconductor substrate as viewed from the first semiconductor layer and has a second aperture communicating with the first aperture, in which the heat dissipation unit is in contact with the semiconductor substrate via the first aperture and the second aperture.

(9)

The semiconductor device according to (8), in which the first semiconductor layer includes a first nitride semiconductor having a first band gap, and the second semiconductor layer includes a second nitride semiconductor having a second band gap larger than the first band gap.

(10)

The semiconductor device according to any one of (1) to (10), further including a plurality of the transistors, in which the plurality of transistors is arranged to be adjacent to each other in a first direction, each of the plurality of transistors includes a gate electrode that extends in a second direction perpendicular to the first direction, and the plurality of transistors satisfies a following condition expression (A):

$$(L2/L1)\leq 2 \quad (A)$$

where L1 is a length of the gate electrode of each of the plurality of transistors in the second direction, and L2 is a distance in the second direction between a center position of the heat dissipation unit in the second direction and a center position of the gate electrode of each of the plurality of transistors in the second direction.

(11)

The semiconductor device according to (10), in which the length of the gate electrode in the second direction is longer than or equal to 25 μm and shorter than or equal to than 200 μm.

(12)

A semiconductor module including:

a semiconductor device including a semiconductor substrate, a first semiconductor layer that is provided on the semiconductor substrate, has a first aperture, and has a first thermal conductivity, a transistor provided on the first semiconductor layer, and a heat dissipation unit that is in contact with the semiconductor substrate via the first aperture and has a second thermal conductivity higher than the first thermal conductivity.

(13)

A wireless communication apparatus including a semiconductor device including a semiconductor substrate, a first semiconductor layer that is provided on the semiconductor substrate, has a first aperture, and has a first thermal conductivity, a transistor provided on the first semiconductor layer, and a heat dissipation unit that is in contact with the semiconductor substrate via the first aperture and has a second thermal conductivity higher than the first thermal conductivity.

The present application claims the benefit of Japanese Priority Patent Application No. 2021-130331 filed with Japan Patent Office on Aug. 6, 2021, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor device, comprising:

a semiconductor substrate;

a first semiconductor layer on the semiconductor substrate, wherein the first semiconductor layer has a first aperture, and a first thermal conductivity;

a transistor on the first semiconductor layer;

a heat dissipation unit in contact with the semiconductor substrate via the first aperture, wherein the heat dissipation unit has a second thermal conductivity higher than the first thermal conductivity; and a plurality of transistors, wherein the plurality of transistors include the transistor, the plurality of transistors is arranged to be adjacent to each other in a first direction, each of the plurality of transistors includes a gate electrode that extends in a second direction perpendicular to the first direction, and the plurality of transistors satisfies a following condition expression (A):

$$(L2/L1)\leq 2 \quad (A)$$

where L1 is a length of the gate electrode of each of the plurality of transistors in the second direction, and L2 is a distance in the second direction between a center position of the heat dissipation unit in the second direction and a center position of the gate electrode of each of the plurality of transistors in the second direction.

2. The semiconductor device according to claim 1, wherein the heat dissipation unit includes metal.

3. The semiconductor device according to claim 1, wherein the heat dissipation unit is electrically isolated from the transistor.

4. The semiconductor device according to claim 1, wherein the transistor includes a source electrode and a drain electrode, and a thickness of the heat dissipation unit is thicker than a thickness of the source electrode and a thickness of the drain electrode.

5. The semiconductor device according to claim 1, wherein the transistor includes a source electrode and a drain electrode, and a volume of the heat dissipation unit is larger than a volume of the source electrode and a volume of the drain electrode.

6. The semiconductor device according to claim 1, wherein the first semiconductor layer includes a group III-V semiconductor.

7. The semiconductor device according to claim 6, wherein the group III-V semiconductor comprises gallium nitride (GaN).

8. The semiconductor device according to claim 1, further comprising a second semiconductor layer on an opposite side to the semiconductor substrate as viewed from the first semiconductor layer, wherein the second semiconductor layer has a second aperture that communicates with the first aperture, and the heat dissipation unit is in contact with the semiconductor substrate via the first aperture and the second aperture.

9. The semiconductor device according to claim 8, wherein the first semiconductor layer includes a first nitride semiconductor having a first band gap, and the second semiconductor layer includes a second nitride semiconductor having a second band gap larger than the first band gap.

10. The semiconductor device according to claim 1, wherein the length of the gate electrode in the second direction is longer than or equal to 25 μm and shorter than or equal to 200 μm.

11. A semiconductor module, comprising:

a semiconductor device including a semiconductor substrate, a first semiconductor layer on the semiconductor substrate, wherein the first semiconductor layer has a first aperture, and a first thermal conductivity, a transistor on the first semiconductor layer, a heat dissipation unit in contact with the semiconductor substrate via the first aperture, wherein the heat dissipation unit has a second thermal conductivity higher than the first thermal conductivity, a plurality of transistors, wherein the plurality of transistors include the transistor, the plurality of transistors is arranged to be adjacent to each other in a first direction, each of the plurality of transistors includes a gate electrode that extends in a second direction perpendicular to the first direction, and the plurality of transistors satisfies a following condition expression (A):

$$(L2/L1) \leq 2 \quad \text{(A)}$$

where L1 is a length of the gate electrode of each of the plurality of transistors in the second direction, and L2 is a distance in the second direction between a center position of the heat dissipation unit in the second direction and a center position of the gate electrode of each of the plurality of transistors in the second direction.

12. A wireless communication apparatus, comprising:

a semiconductor device including a semiconductor substrate, a first semiconductor layer on the semiconductor substrate, wherein the first semiconductor layer has a first aperture, and a first thermal conductivity, a transistor on the first semiconductor layer, a heat dissipation unit in contact with the semiconductor substrate via the first aperture, wherein the heat dissipation unit has a second thermal conductivity higher than the first thermal conductivity, and a plurality of transistors, wherein the plurality of transistors include the transistor, the plurality of transistors is arranged to be adjacent to each other in a first direction, each of the plurality of transistors includes a gate electrode that extends in a second direction perpendicular to the first direction, and the plurality of transistors satisfies a following condition expression (A):

$$(L2/L1) \leq 2 \quad \text{(A)}$$

where L1 is a length of the gate electrode of each of the plurality of transistors in the second direction, and L2 is a distance in the second direction between a center position of the heat dissipation unit in the second direction and a center position of the gate electrode of each of the plurality of transistors in the second direction.

* * * * *